(12) United States Patent
Mehrotra et al.

(10) Patent No.: US 9,000,539 B2
(45) Date of Patent: Apr. 7, 2015

(54) METAL-GATE MOS TRANSISTOR AND METHOD OF FORMING THE TRANSISTOR WITH REDUCED GATE-TO-SOURCE AND GATE-TO-DRAIN OVERLAP CAPACITANCE

(71) Applicant: Texas Instruments Incorporated, Dallas, TX (US)

(72) Inventors: Manoj Mehrotra, Plano, TX (US); Hiroaki Niimi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 13/671,730

(22) Filed: Nov. 8, 2012

(65) Prior Publication Data

US 2014/0124874 A1 May 8, 2014

(51) Int. Cl.
| | |
|---|---|
| H01L 29/76 | (2006.01) |
| H01L 29/94 | (2006.01) |
| H01L 21/28 | (2006.01) |
| H01L 29/423 | (2006.01) |
| H01L 29/66 | (2006.01) |
| H01L 29/78 | (2006.01) |
| H01L 29/49 | (2006.01) |
| H01L 29/51 | (2006.01) |

(52) U.S. Cl.
CPC ..... *H01L 29/66545* (2013.01); *H01L 21/28114* (2013.01); *H01L 29/42376* (2013.01); *H01L 29/4966* (2013.01); *H01L 29/517* (2013.01); *H01L 29/6656* (2013.01); *H01L 29/6659* (2013.01); *H01L 29/7833* (2013.01)

(58) Field of Classification Search
CPC ... H01L 29/78; H01L 29/66545; H01L 29/49; H01L 21/336
USPC ............ 257/410, E29.255, E21.409; 438/197
See application file for complete search history.

(56) References Cited

U.S. PATENT DOCUMENTS

| | | |
|---|---|---|
| 6,509,234 B1 | 1/2003 | Krivokapic |
| 6,780,694 B2 | 8/2004 | Doris et al. |
| 2005/0269644 A1 | 12/2005 | Brask et al. |
| 2007/0001239 A1 | 1/2007 | Deleonibus |
| 2012/0043623 A1* | 2/2012 | Doris et al. ................... 257/410 |

* cited by examiner

*Primary Examiner* — Theresa T Doan
(74) *Attorney, Agent, or Firm* — Jacqueline J. Garner; Frank Cimino

(57) ABSTRACT

The gate-to-source and gate-to-drain overlap capacitance of a MOS transistor with a metal gate and a high-k gate dielectric are reduced by forming the high-k gate dielectric along the inside of a sidewall structure which has been formed to lie further away from the source and the drain.

6 Claims, 8 Drawing Sheets

METAL-GATE MOS TRANSISTOR AND METHOD OF FORMING THE TRANSISTOR WITH REDUCED GATE-TO-SOURCE AND GATE-TO-DRAIN OVERLAP CAPACITANCE

BACKGROUND OF THE INVENTION

1. Field of the Invention

The present invention relates to metal-gate MOS transistors and, more particularly, to a metal-gate MOS transistor and a method of forming the transistor with reduced gate-to-source and gate-to-drain overlap capacitance.

2. Description of the Related Art

A metal oxide semiconductor (MOS) transistor is a well-known semiconductor device which can be implemented as either an n-channel (NMOS) device or a p-channel (PMOS) device. A MOS transistor has spaced-apart source and drain regions, which are separated by a channel, and a gate that lies over, and is insulated from, the channel by a gate dielectric layer. A metal-gate MOS transistor is a type of MOS transistor that utilizes a metal gate and a high-k gate dielectric layer.

FIG. 1 shows a cross-sectional view that illustrates a prior-art metal-gate MOS transistor 100. As shown in FIG. 1, MOS transistor 100 includes a semiconductor body 110. Semiconductor body 110, in turn, includes a single-crystal-silicon substrate region 112, and a trench isolation structure 114 that touches substrate region 112.

In addition, semiconductor body 110 includes a source 120 and a drain 122 that each touch substrate region 112. The source 120 and drain 122 each has a conductivity type that is the opposite of the conductivity type of substrate region 112. Source 120 includes a lightly-doped region 120L, and a heavily-doped region 120H. Similarly, drain 122 includes a lightly-doped region 122L, and a heavily-doped region 122H. Further, substrate region 112 has a channel region 124 that lies between source 120 and drain 122.

As further shown in FIG. 1, MOS transistor 100 includes a high-k gate dielectric structure 126 that touches and lies over channel region 124, and a metal gate 130 that touches gate dielectric structure 126 and lies over channel region 124. MOS transistor 100 also includes a sidewall spacer 132 that touches gate dielectric structure 126 and laterally surrounds gate 130.

MOS transistor 100 additionally includes a non-conductive interconnect dielectric structure 138 that touches sidewall spacer 132 and lies over source 120 and drain 122. Dielectric structure 138 can be implemented with an etch stop layer 140 and a dielectric layer 142 that touches and lies over etch stop layer 140.

The threshold voltage of a transistor is the gate voltage required to form an inversion layer at the top surface of the channel region that is sufficient to allow a current to flow from the source region to the drain region. In the case of an NMOS transistor, n-type dopant atoms form the inversion layer, while p-type dopant atoms form the inversion layer in the case of a PMOS transistor.

In operation, with respect to NMOS transistors, when a positive drain-to-source voltage $V_{DS}$ is present, and the gate-to-source voltage $V_{GS}$ is more positive than the threshold voltage, the NMOS transistor turns on and electrons flow from the source region to the drain region. When the gate-to-source voltage $V_{GS}$ is more negative than the threshold voltage, the MOS transistor turns off and no electrons (other than a very small leakage current) flow from the source region to the drain region.

With respect to PMOS transistors, when a negative drain-to-source voltage $V_{DS}$ is present, and the gate-to-source voltage $V_{GS}$ is more negative than the threshold voltage, the PMOS transistor turns on and holes flow from the source region to the drain region. When the gate-to-source voltage $V_{GS}$ is more positive than the threshold voltage, the PMOS transistor turns off and no holes (other than a very small leakage current) flow from the source region to the drain region.

One of the problems with MOS transistor 100 is that high-k gate dielectric structure 126 substantially increases the gate-to-source and gate-to-drain overlap capacitance. Thus, there is a need for a metal-gate MOS transistor that reduces the gate-to-source and gate-to-drain overlap capacitance associated with a high-k dielectric structure.

SUMMARY OF THE INVENTION

The present invention provides a metal-gate MOS transistor and a method of forming the transistor that reduce the gate-to-source and gate-to-drain overlap capacitance. A semiconductor structure of the present invention includes a semiconductor region that has a conductivity type. The semiconductor structure also includes a source and a drain that each touches the semiconductor region. The source and drain, which are spaced apart, each has a conductivity type that is opposite to the conductivity type of the semiconductor region. The semiconductor structure further includes a channel region of the semiconductor region that lies between the source and the drain. In addition, the semiconductor structure includes a gate dielectric that touches and lies over the channel region, and a metal gate that touches and lies over the gate dielectric. The metal gate has a lower width and an upper width that is greater than the lower width.

The semiconductor structure of the present invention alternately includes a semiconductor region that has a conductivity type. The semiconductor structure also includes a source and a drain that each touches the semiconductor region. The source and drain, which are spaced apart, each has a conductivity type that is opposite to the conductivity type of the semiconductor region. The semiconductor structure further includes a channel region of the semiconductor region that lies between the source and the drain. In addition, the semiconductor structure includes a gate dielectric that touches and lies over the channel region, and a metal gate that touches and lies over the gate dielectric. Further, the semiconductor structure includes a non-conductive sidewall spacer that touches the gate dielectric and laterally surrounds both the gate dielectric and the metal gate. A portion of the non-conductive sidewall spacer lies directly vertically between the semiconductor region and the metal gate.

A method of forming a semiconductor structure includes forming a gate structure that touches a semiconductor region. The gate structure has a sacrificial gate dielectric and a sacrificial gate. The sacrificial gate dielectric touches the semiconductor region. The sacrificial gate touches the sacrificial gate dielectric. The semiconductor region has a conductivity type. The method also includes etching away a portion of the sacrificial gate dielectric to form a sacrificial dielectric structure and a cavity. The sacrificial dielectric structure touches the sacrificial gate and the semiconductor region. The cavity lies directly vertically below a portion of the sacrificial gate. The method further includes forming a source and a drain that touch the semiconductor region after the sacrificial dielectric structure has been formed. The source and the drain each has a conductivity type that is opposite the conductivity type of the semiconductor region.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
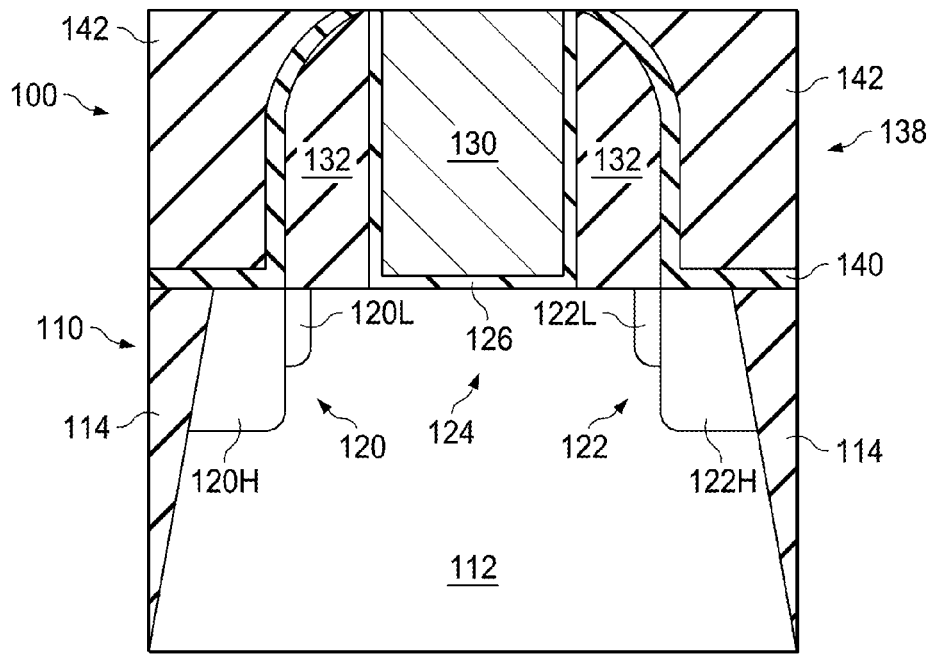
FIG. 1 is a cross-sectional view illustrating a prior-art metal-gate MOS transistor 100.
Figure 2:
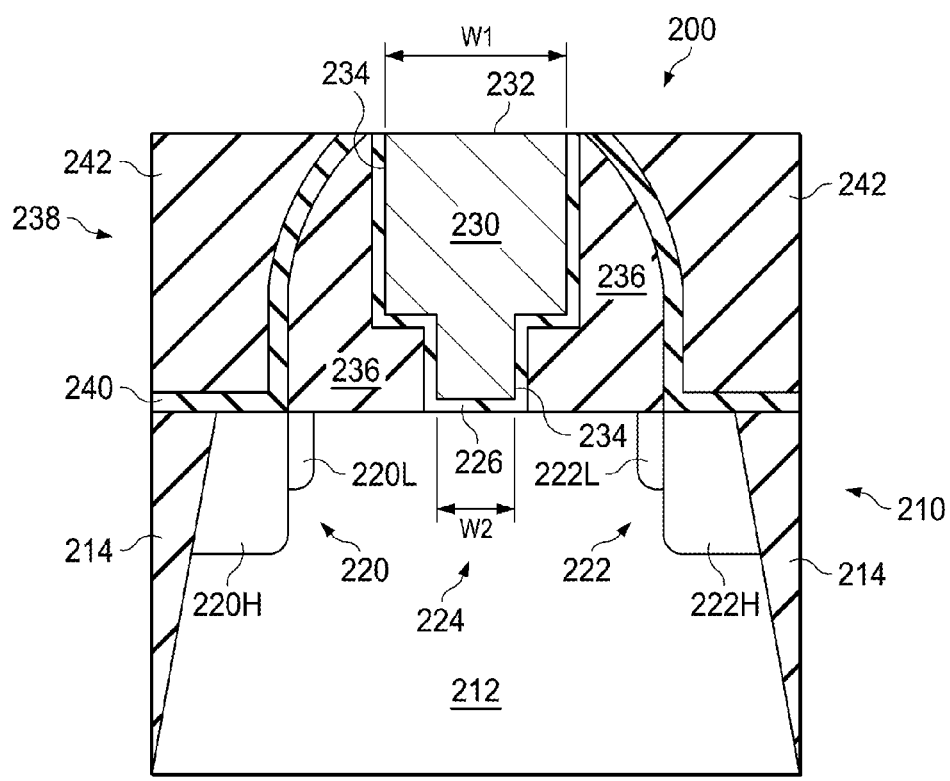
FIG. 2 is a cross-sectional view illustrating an example of a metal-gate MOS transistor 200 in accordance with the present invention.

FIG. 2 shows a cross-sectional view that illustrates an example of a metal-gate MOS transistor 200 in accordance with the present invention. As described in greater detail below, the present invention reduces the gate-to-source and gate-to-drain overlap capacitance by forming the high-k gate dielectric along the inside of a sidewall structure which has been formed to lie further away from the source and the drain.

As shown in FIG. 2, MOS transistor 200 includes a semiconductor body 210. Semiconductor body 210, in turn, includes a single-crystal-silicon substrate region 212, and a trench isolation structure 214 that touches substrate region 212. In addition, semiconductor body 210 includes a source 220 and a drain 222 that each touch substrate region 212.

The source 220 and drain 222, which are spaced apart, each has a conductivity type that is the opposite of the conductivity type of substrate region 212. Source 220 includes a lightly-doped region 220L, and a heavily-doped region 220H. Similarly, drain 222 includes a lightly-doped region 222L, and a heavily-doped region 222H. Further, substrate region 212 has a channel region 224 that lies between source 220 and drain 222.

As further shown in FIG. 2, MOS transistor 200 also includes a high-k gate dielectric 226 that touches and lies over channel region 224. High-k gate dielectric structure 226 can be implemented with a number of materials, such as sequential layers of hafnium oxide and hafnium silicon oxide.

MOS transistor 200 additionally includes a metal gate 230 that touches gate dielectric structure 226 and lies over channel region 224. Metal gate 230 has a T-shape with an upper width W1 that is greater than a lower width W2. Further, metal gate 230 has a top surface 232 and an outer surface 234 that touches the top surface 232. High-k gate dielectric structure 226 touches and covers all of the outer surface 234 of metal gate 230. Metal gate 230 can be implemented with a number of materials, such as sequential layers of titanium nitride, tantalum nitride, and aluminum.

MOS transistor 200 also includes a sidewall spacer 236 that touches high-k gate dielectric structure 226 and laterally surrounds both high-k gate dielectric structure 226 and metal gate 230. Further, a portion of sidewall spacer 236 lies directly vertically between a portion of metal gate 230 and channel region 224. Sidewall spacer 236 can also include a number of individual sidewall spacers that touch each other, such as an oxide sidewall spacer that touches a nitride (with a thin oxide underliner) sidewall spacer. Sidewall spacer 236 can be implemented with a number of materials, such as oxide and nitride.

MOS transistor 200 additionally includes a non-conductive interconnect dielectric structure 238 that touches sidewall spacer 236 and lies over source 220 and drain 222. In the present example, dielectric structure 238 is implemented with an etch stop layer 240, and a dielectric layer 242 that touches and lies over etch stop layer 240. Etch stop layer 240 can each be implemented with a number of materials, such as silicon nitride or silicon oxynitride. Dielectric layer 242 can be implemented with a number of materials, such as oxide. MOS transistor 200 operates substantially the same as MOS transistor 100, except that MOS transistor 200 has less gate-to-source and gate-to-drain overlap capacitance.

Figure 3A:
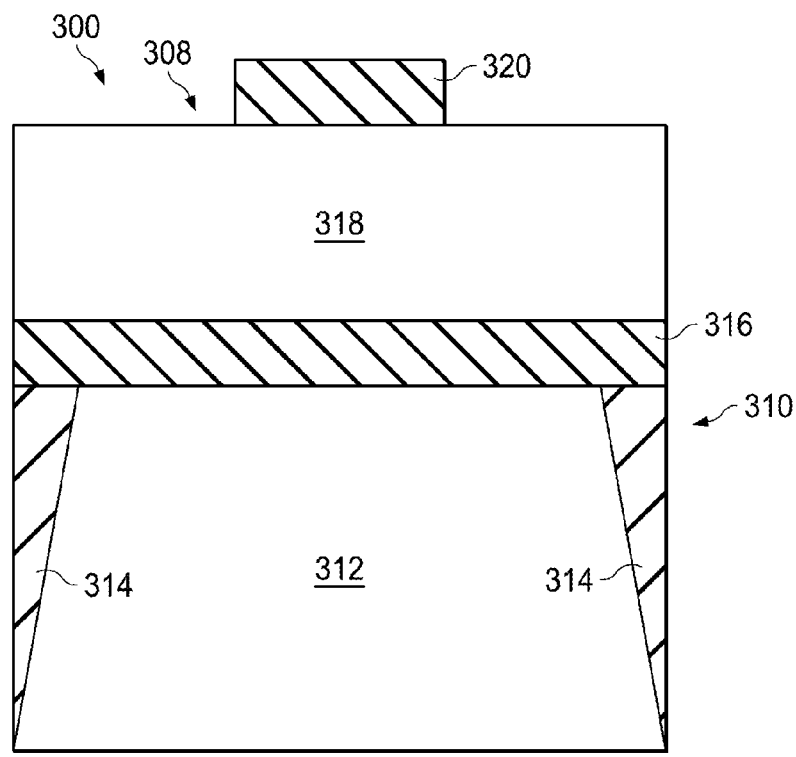
FIGS. 3A-3M are cross-sectional views illustrating an example of a method 300 of forming a metal-gate MOS transistor in accordance with the present invention.

FIGS. 3A-3M show cross-sectional views that illustrate an example of a method 300 of forming a metal-gate MOS transistor in accordance with the present invention. As shown in FIG. 3A, method 300 utilizes a partially-completed conventionally-formed transistor structure 308 that includes a semiconductor body 310. Semiconductor body 310, in turn, includes a single-crystal-silicon substrate region 312 and a trench isolation structure 314 that touches substrate 312.

As further shown in FIG. 3A, method 300 begins by forming a sacrificial gate dielectric layer 316 that touches and lies over substrate region 312. In the present example, sacrificial gate dielectric layer 316 is formed using conventional procedures to be relatively thick, having a thickness of, for example, 1 nm-5 nm. Sacrificial gate dielectric layer 316 can be implemented with a number of sacrificial materials, such as oxide.

After sacrificial gate dielectric layer 316 has been formed, a sacrificial gate layer 318 is formed using conventional procedures to touch and lie over sacrificial gate dielectric layer 316. Sacrificial gate layer 318 can be implemented with a number of sacrificial materials, such as polycrystalline silicon.

Following this, a patterned mask 320 is formed on sacrificial gate layer 318 using conventional procedures. A patterned mask can be implemented in a number of ways, such as a hard mask or a patterned photoresist layer. (A hard mask is commonly formed by depositing a layer of oxide followed by an overlying layer of nitride. A patterned photoresist layer is next formed on the nitride layer, and the exposed regions of the nitride layer are then etched away. The patterned photoresist layer is removed after the etch to form the hard mask.)

Figure 3B:
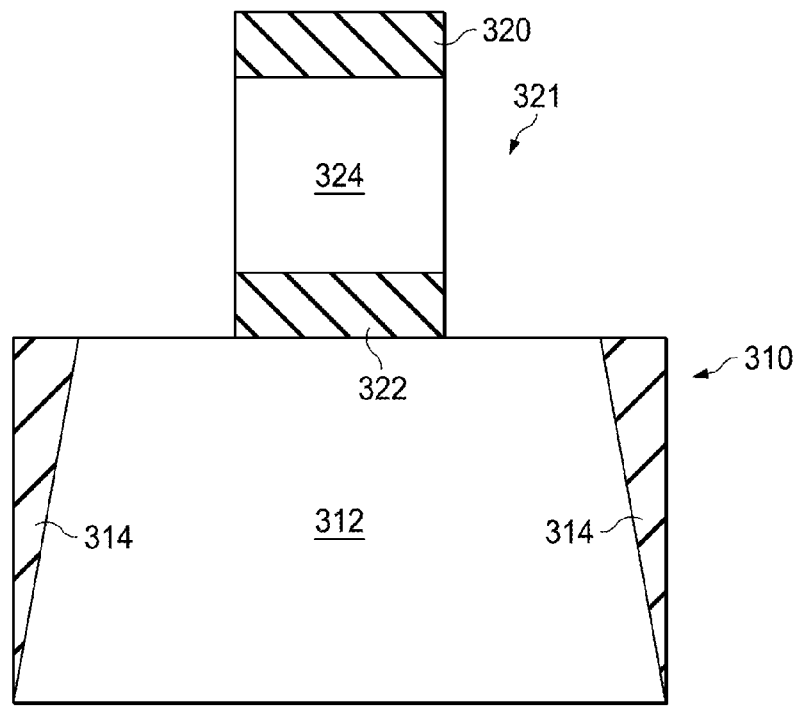

As shown in FIG. 3B, after patterned mask 320 has been formed, the exposed regions of sacrificial gate layer 318 and sacrificial gate dielectric layer 316 are etched away using conventional procedures to expose the top surface of substrate region 312 and form a sacrificial gate structure 321. Sacrificial gate structure 321, in turn, includes a sacrificial gate dielectric 322 that touches and lies above substrate region 312, and a sacrificial gate 324 that touches and lies over sacrificial gate dielectric 322. Following the etch, patterned mask 320 is removed in a conventional manner.

Figure 3C:
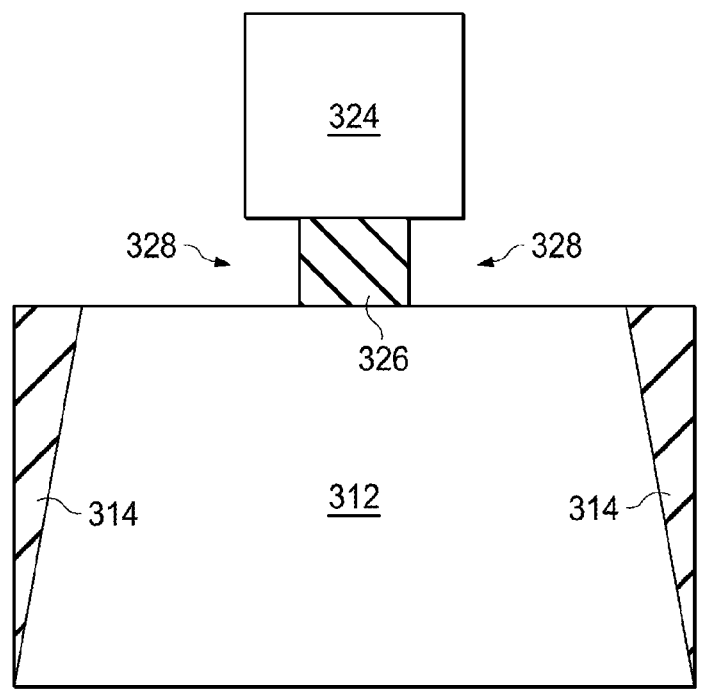

As shown in FIG. 3C, after patterned mask 320 has been removed, sacrificial gate dielectric 322 is wet etched or isotropically dry etched with an etchant that removes substantially more of dielectric 322 than silicon. The etch forms a sacrificial dielectric structure 326 that touches and lies between sacrificial gate 324 and substrate region 312, and a cavity 328 that lies directly vertically between a portion of sacrificial gate 324 and substrate region 312. In the present example, cavity 328 is formed to have a depth (measured horizontally) of 1 nm to 5 nm.

Figure 3D:
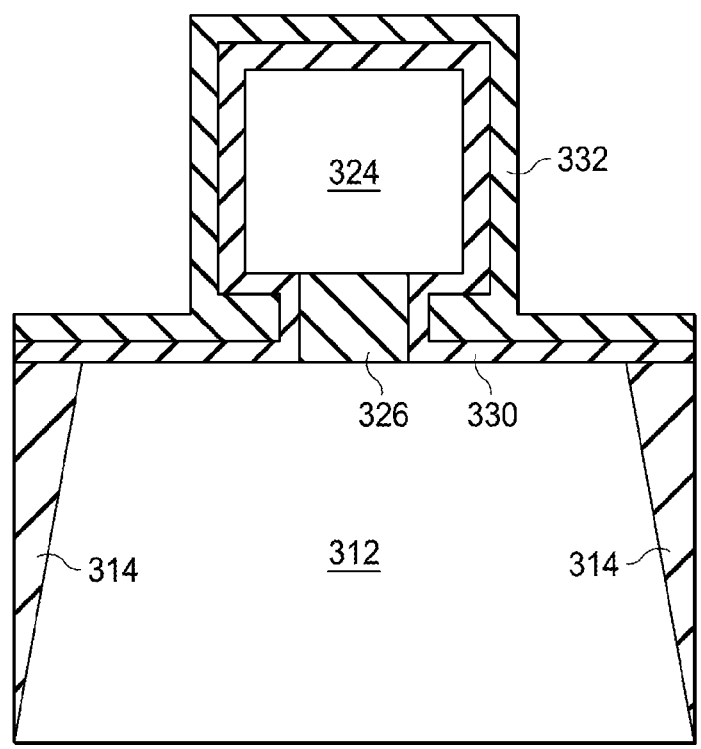

As shown in FIG. 3D, after sacrificial dielectric structure 326 has been formed, a non-conductive etch resistant layer 330 is conformally formed on substrate region 312, sacrificial gate 324, and sacrificial dielectric structure 326 to line cavity 328 using conventional procedures. In the present example, etch resistant layer 330 is formed to have a thickness of 1 nm to 5 nm.

Etch resistant layer 330 can be formed with a number of materials, such as nitride. A nitride layer can be formed by using, for example, a conventional silicon nitride chemical-vapor-deposition (CVD) or atomic layer deposition (ALD) process (which forms a thin oxide underliner before the nitride layer), a conventional heavily nitrided oxide growth process (e.g., thermal oxide growth in ammonia), a combination of a CVD nitride and nitrided oxide growth, or a conventional plasma nitridation process.

For example, etch resistant layer 330 can be formed from nitride when sacrificial gate 324 is implemented with polysilicon and sacrificial dielectric structure 326 is implemented with oxide. When etch resistant layer 330 is implemented with nitride, having a thinner nitride layer reduces capacitance.

After etch resistant layer 330 has been formed, a non-conductive layer 332 is formed on etch resistant layer 330 using conventional steps to cover etch resistant layer 330 and fill up cavity 328. Non-conductive layer 332 can be formed with a number of materials, such as deposited oxide or oxide grown in pure nitrous oxide ($N_2O$), pure nitric oxide (NO) gas, or a combination of $N_2O$ gas and NO gas. In the present example, non-conductive layer 332 is formed to have a thickness of 1 nm to 2 nm.

Figure 3E:
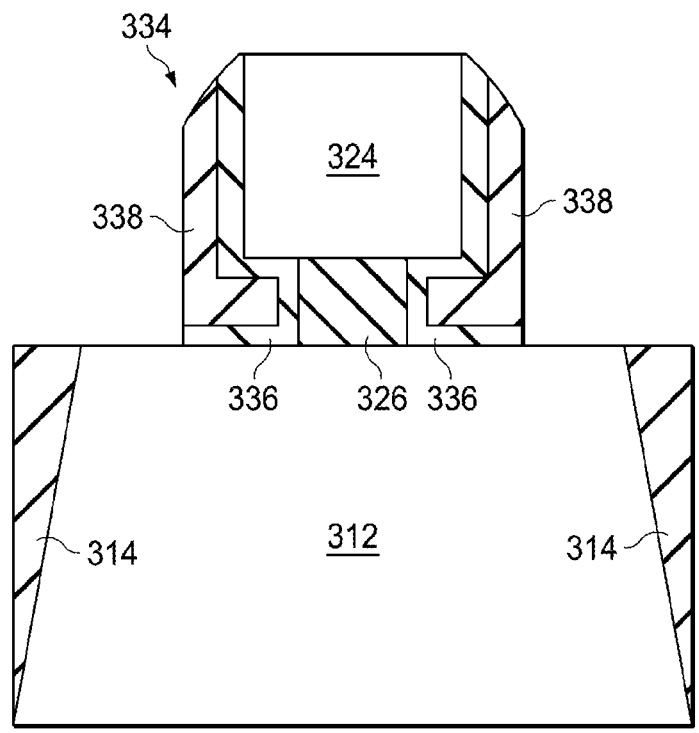

As shown in FIG. 3E, after non-conductive layer 332 has been formed, etch resistant layer 330 and non-conductive layer 332 are anisotropically etched until the top surface of sacrificial gate 324 is exposed. The anisotropic etch forms a sidewall spacer 334 that has a non-conductive etch resistant section 336 and a non-conductive section 338. (Non-conductive layer 332 and non-conductive structure 338 can be omitted when etch resistant layer 330 is thick enough to fill up cavity 328.)

Figure 3F:
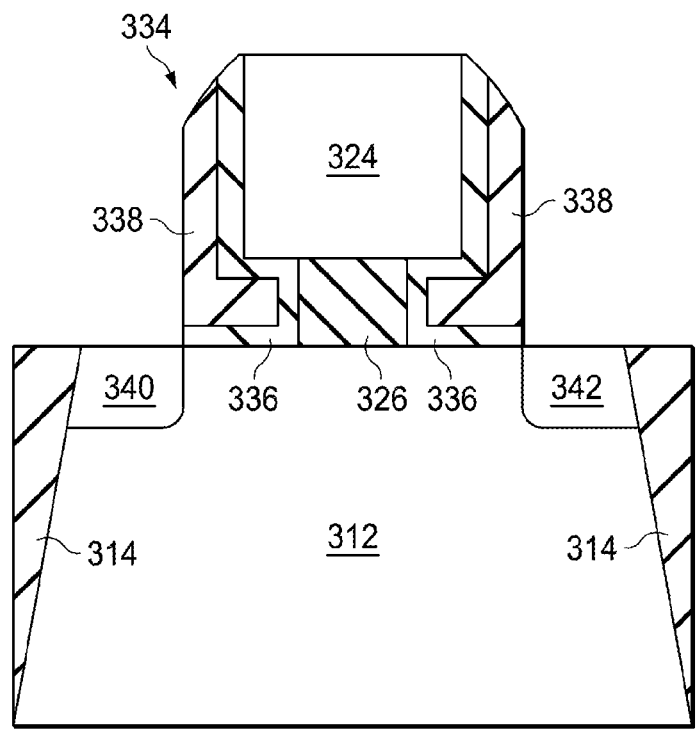

As shown in FIG. 3F, after sidewall spacer 334 has been formed, a dopant is implanted into substrate region 312 in a conventional fashion to form spaced-apart lightly-doped regions 340 and 342. The lightly-doped regions 340 and 342 have a conductivity type that is opposite to the conductivity type of substrate region 312.

Figure 3G:
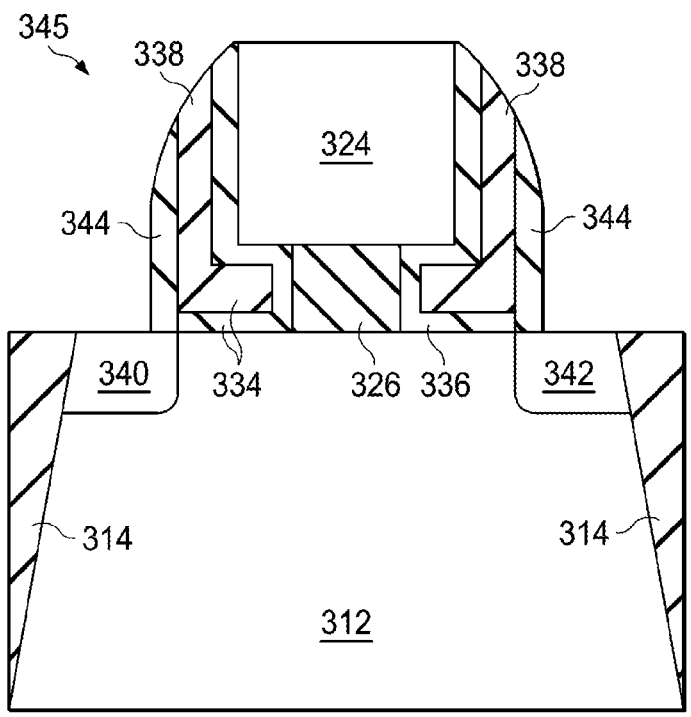

As shown in FIG. 3G, after the lightly-doped regions 340 and 342 have been formed, a non-conductive side wall spacer 344 is formed to touch sidewall spacer 334 and laterally surround sacrificial gate 324. Non-conductive side wall spacer 344 can be formed in a number of ways. For example, a layer of nitride can be formed on sacrificial gate 324 and sidewall spacer 334, and then anisotropically etched until the top surface of sacrificial gate 324 is exposed to form side wall spacer 344. Sidewall spacer 334 and sidewall spacer 344 together form a sidewall spacer 345.

Figure 3H:
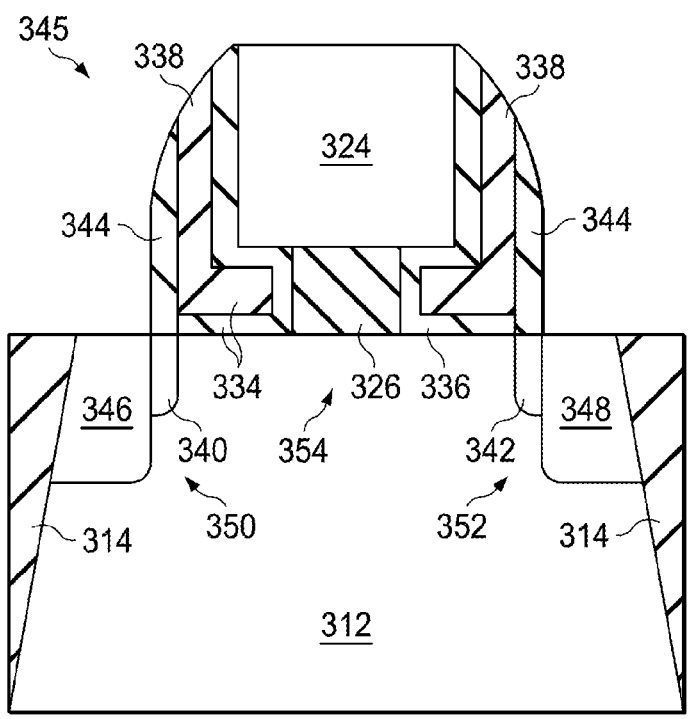

As shown in FIG. 3H, after side wall spacer 345 has been formed, a dopant is implanted into substrate region 312 and the lightly-doped regions 340 and 342 in a conventional fashion to form spaced-apart heavily-doped regions 346 and 348. The heavily-doped regions 346 and 348 each have a conductivity type that is opposite to the conductivity type of substrate region 312.

Lightly-doped region 340 and heavily-doped region 346 form a source 350, while lightly-doped region 342 and heavily-doped region 348 form a drain 352. The source and drain regions 350 and 352 define a channel region 354 of substrate region 312 that lies between and separates the source and drain regions 350 and 352.

Figure 3I:
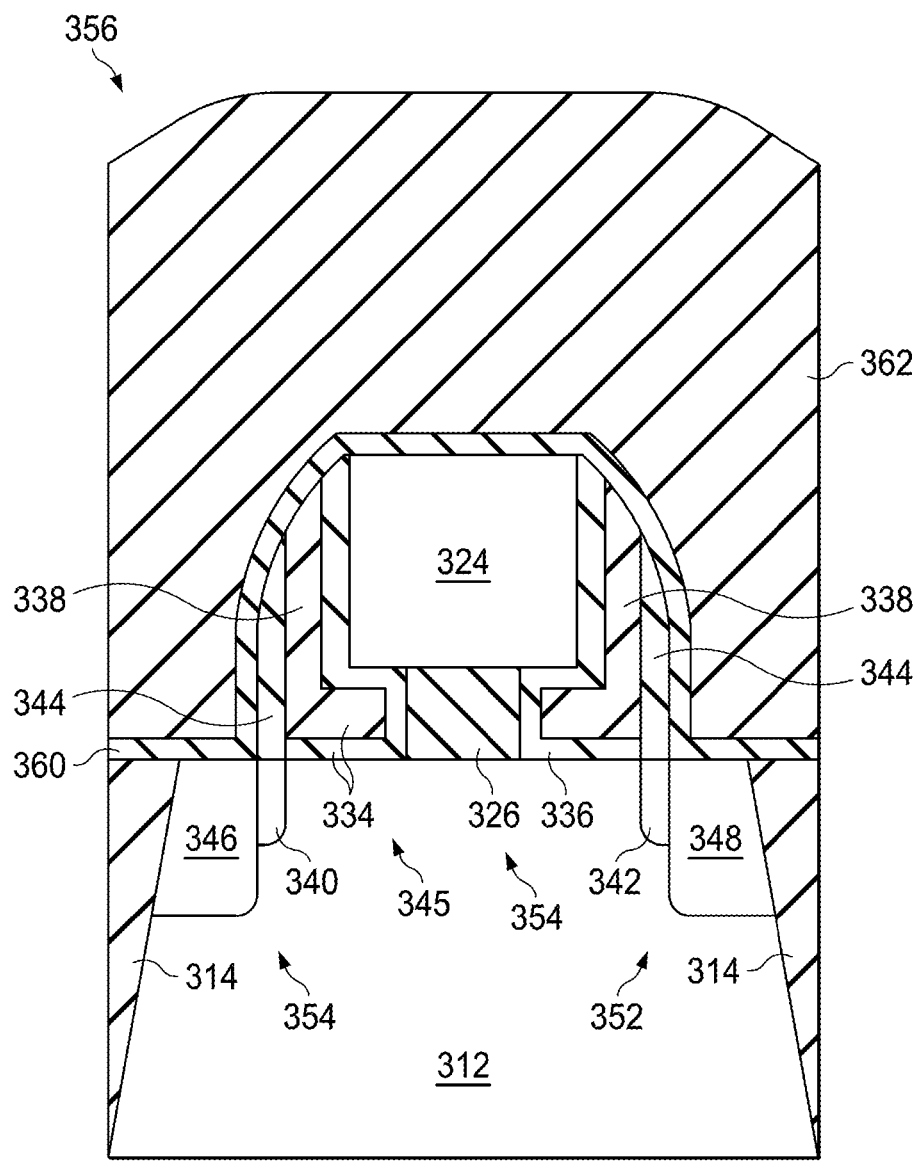

As shown in FIG. 3I, after the source and drain regions 350 and 352 have been formed, a non-conductive interconnect dielectric layer 356 is formed in a conventional manner to touch and lie over sacrificial gate 324, sidewall spacer 345, source region 350, and drain region 352. In the present example, interconnect dielectric layer 356 is formed by first depositing a non-conductive etch stop layer 360 using conventional procedures to touch and lie over sacrificial gate 324, sidewall spacer 345, source region 350, and drain region 352.

Following this, a non-conductive dielectric layer 362 is formed to touch and lie over etch stop layer 360. Etch stop layer 360 can be implemented with a number of materials, such as silicon nitride or silicon oxynitride, while dielectric layer 362 can be implemented with a number of materials, such as oxide.

Figure 3J:
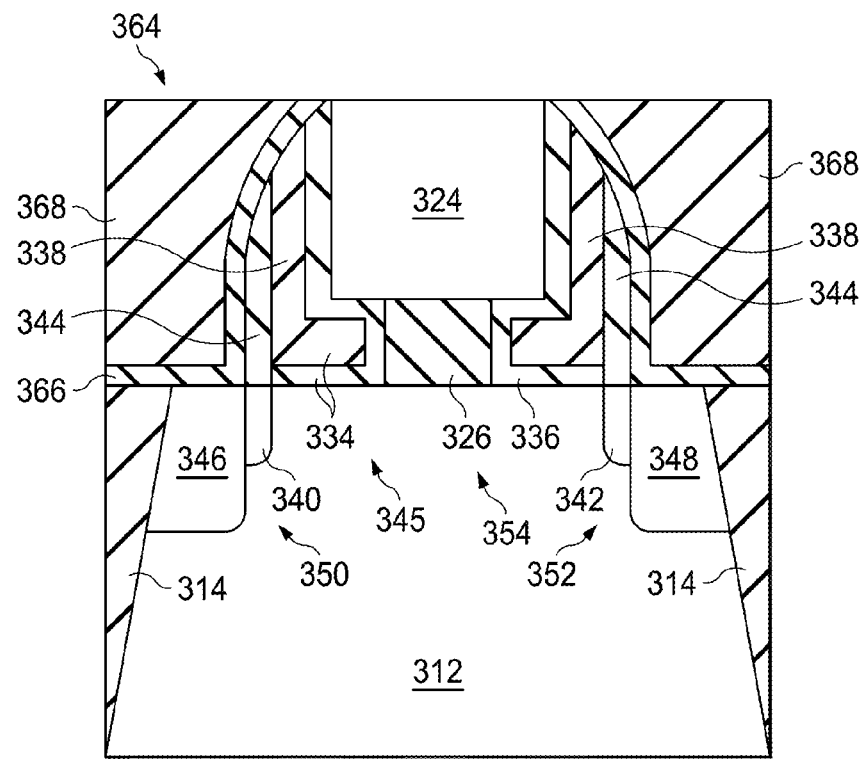

As shown in FIG. 3J, after dielectric layer 356 has been formed, dielectric layer 356 is planarized, such as with chemical-mechanical polishing, until the top surface of sacrificial gate 324 is exposed. In the present example, dielectric layer 356 is planarized by first planarizing dielectric layer 362 until the top surface of etch stop layer 360 is detected. Following this, etch stop layer 360 and dielectric layer 362 are removed with a wet/dry etch until the top surface of sacrificial gate 324 is exposed.

The planarization forms an interconnect dielectric structure 364 that touches sidewall spacer 345 and lies over source 350 and drain 352. In the present example, interconnect dielectric structure 364 includes an etch stop section 366 that touches sidewall spacer 345, and a dielectric section 368 that touches etch stop section 366. (Etch stop layer 360 and etch stop section 366 can be optionally omitted.) As a result of the planarization, the top surfaces of sacrificial gate 324 and interconnect dielectric structure 364 lie substantially in the same plane.

Figure 3K:
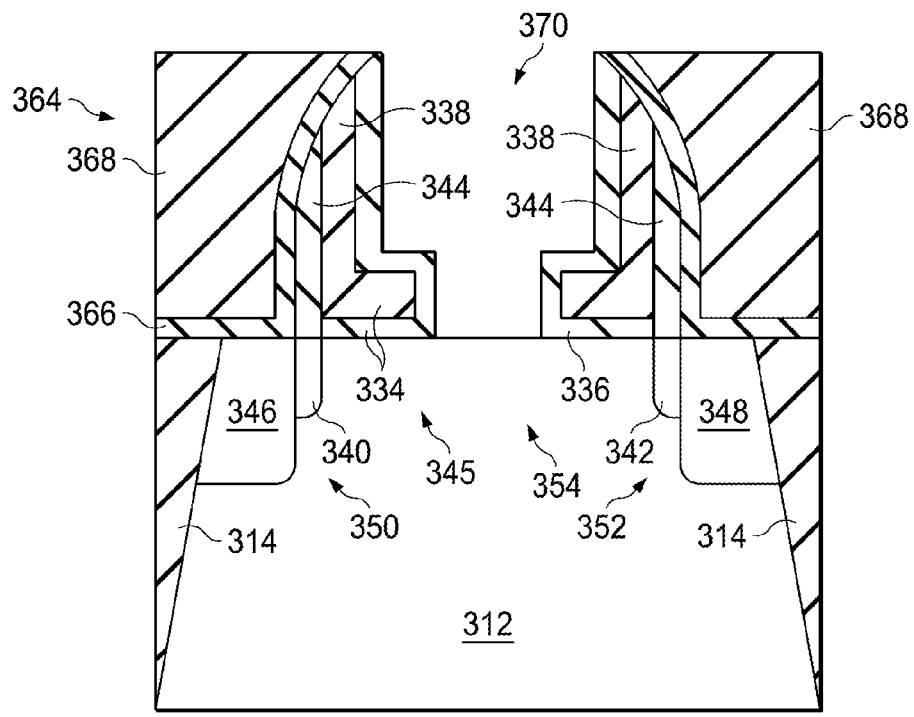

As shown in FIG. 3K, after the top surface of sacrificial gate 324 has been exposed, sacrificial gate 324 is removed using conventional etchants and procedures. Next, sacrificial dielectric structure 326 is removed using conventional etchants and procedures to form an opening 370 that exposes etch resistant section 336 and the top surface of channel region 354.

Figure 3L:
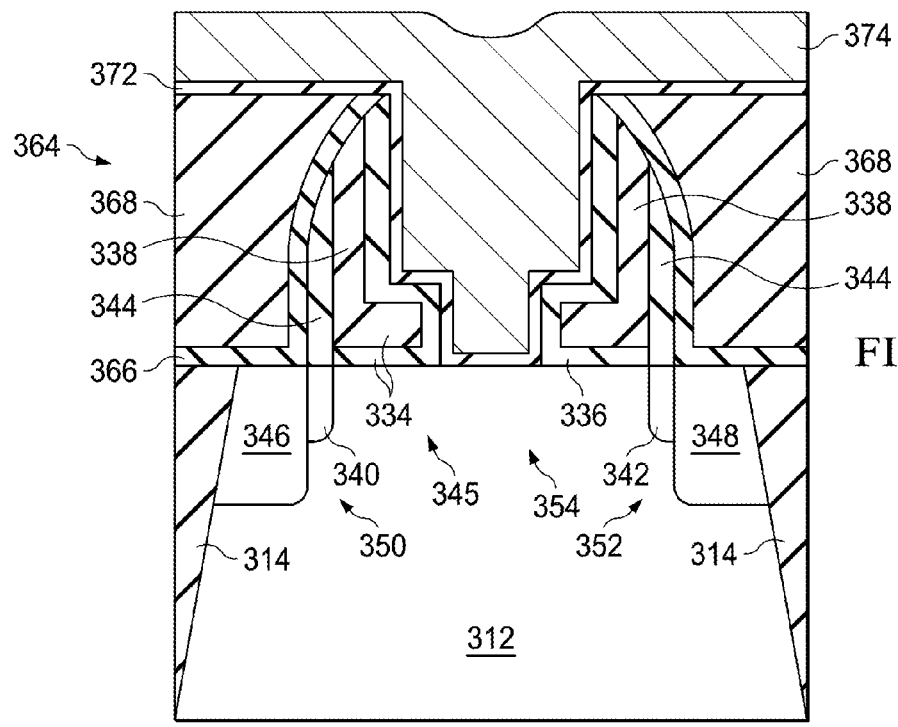

As shown in FIG. 3L, after opening 370 has been formed, a high-k gate dielectric layer 372 is formed in a conventional manner to line opening 370 and touch the top surface of dielectric structure 364. High-k gate dielectric layer 372, which has a different material composition than sidewall spacer 345, can be implemented with a number of materials, such as sequential layers of hafnium oxide and hafnium silicon oxide.

Next, a metal layer 374 is conventionally deposited to touch high-k gate dielectric layer 372 and fill up opening 370. Metal layer 374 can be implemented with a number of materials that each partially fill up opening 370, such as sequential layers of titanium nitride, tantalum nitride, and aluminum.

Figure 3M:
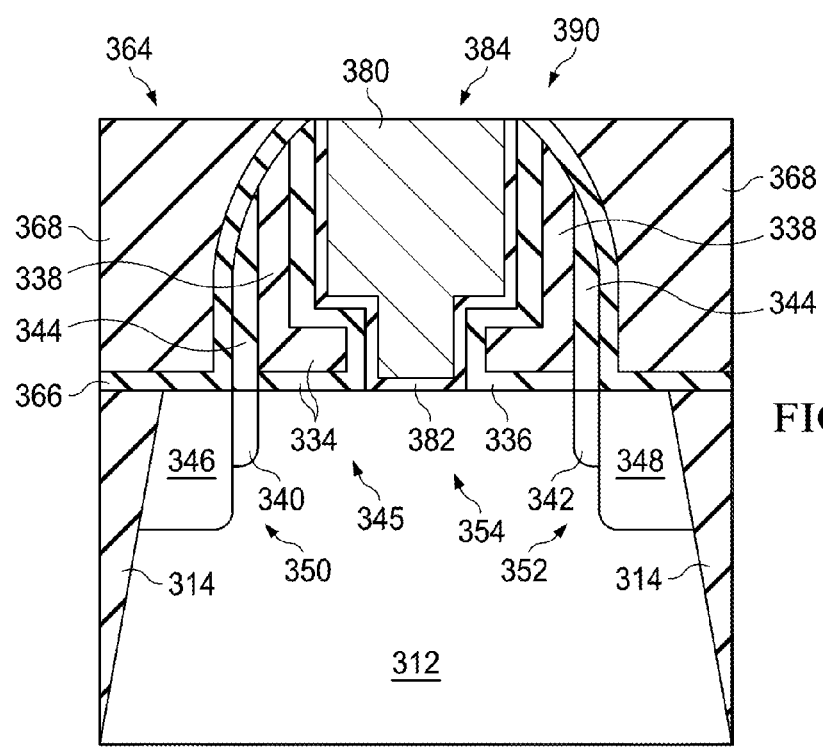

As shown in FIG. 3M, after metal layer 374 has been deposited, the high-k dielectric layer 372 and metal layer 374 are planarized, such as with chemical-mechanical polishing, until the top surface of dielectric structure 364 has been exposed. The planarization forms a metal gate 380 and a high-k dielectric structure 382 that touches metal gate 380 and channel region 354 in opening 370. Metal gate 380 and high-k dielectric structure 382 form a gate structure 384. The planarization also forms a metal-gate MOS transistor 390. As a result of the planarization, the top surfaces of dielectric structure 364, metal gate 380, and high-k dielectric structure 382 lie substantially in the same plane. Following this, method 300 continues with conventional steps.

One of the advantages of the present invention is that metal gate 230/380 is separated from the source and drain regions 220/350 and 222/352 by a larger distance than the distance that separates metal gate 130 from the source and drain regions 120 and 122. The larger the separation distance, in turn, the more the overlap capacitance is reduced.

Thus, the thicker the sacrificial gate dielectric layer 316 is formed, the larger the vertical distance that separates metal gate 230/380 from the source and drain regions 220/350 and 222/352. Further, the deeper cavity 328 is formed, the larger the horizontal distance that separates metal gate 230/380 from the source and drain regions 220/350 and 222/352.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:
    forming a gate structure that touches a semiconductor region, the gate structure having a sacrificial gate dielectric and a sacrificial gate, the sacrificial gate dielectric touching the semiconductor region, the sacrificial gate touching the sacrificial gate dielectric, the semiconductor region having a conductivity type;
    etching away a portion of the sacrificial gate dielectric to form a sacrificial dielectric structure and a cavity, the sacrificial dielectric structure touching the sacrificial gate and the semiconductor region, the cavity lying directly vertically below a portion of the sacrificial gate;
    forming a source and a drain that touch the semiconductor region after the sacrificial dielectric structure has been formed, the source and the drain each having a conductivity type that is opposite the conductivity type of the semiconductor region;
    forming a conformal etch resistant layer on exposed surfaces of the sacrificial gate and sacrificial dielectric structure including within the cavity;
    forming a non-conductive layer over the conformal etch resistant layer, the non-conductive layer filling the cavity; and
    forming a sidewall spacer from the conformal etch resistant layer and the non-conductive layer.

2. The method of claim 1 and further comprising removing the gate structure to form an opening after the non-conductive sidewall spacer has been formed, the opening exposing a channel region of the semiconductor region.

3. The method of claim 2 and further comprising forming a gate dielectric structure and a metal gate in the opening, the gate dielectric structure touching the semiconductor region and the conformal etch resistant layer, the metal gate touching the gate dielectric structure and the conformal etch resistant layer.

4. The method of claim 3 wherein the gate dielectric structure and the non-conductive sidewall spacer have different material compositions.

5. A method of forming a semiconductor structure comprising:
    forming a sacrificial gate dielectric layer over a semiconductor region;
    forming a sacrificial gate over the sacrificial gate dielectric layer;
    etching the sacrificial gate dielectric layer to undercut the sacrificial gate dielectric layer from the sacrificial gate to create a cavity, the cavity lying directly vertically below a portion of the sacrificial gate;
    forming a conformal etch resistant layer on exposed surfaces of the sacrificial gate and sacrificial gate dielectric layer including within the cavity;
    forming a non-conductive layer over the conformal etch resistant layer, the non-conductive layer filling the cavity;
    forming a sidewall spacer from the conformal etch resistant layer and the non-conductive layer;
    forming a source and a drain that touch the semiconductor region;
    removing the sacrificial gate and sacrificial gate dielectric layer to expose the conformal etch resistant layer;
    forming a gate dielectric layer on the conformal etch resistant layer; and
    forming a metal gate on the gate dielectric layer, such that the conformal etch resistant layer extends along the gate dielectric layer from a top region of the metal gate to the semiconductor region.

6. A method of forming a semiconductor structure comprising:
    forming a sacrificial gate dielectric layer over a semiconductor region;
    forming a polysilicon gate layer over the sacrificial gate dielectric layer;
    patterning the sacrificial gate dielectric layer and polysilicon gate layer to form a sacrificial gate structure including a sacrificial gate dielectric and a sacrificial gate;
    etching the sacrificial gate dielectric to undercut the sacrificial gate dielectric from the sacrificial gate to create a cavity, the cavity lying directly vertically below a portion of the sacrificial gate;
    forming a conformal nitride layer on vertical and horizontal surfaces of the sacrificial gate and on vertical surfaces of the sacrificial gate dielectric including within the cavity;
    forming an oxide layer over the conformal nitride layer, the oxide layer filling the cavity;
    forming a sidewall spacer from the conformal nitride layer and the oxide layer;
    forming a source and a drain that touch the semiconductor region;
    removing the sacrificial gate and sacrificial gate dielectric to expose the conformal nitride layer;
    forming a gate dielectric layer on the conformal nitride layer; and
    forming a metal gate on the gate dielectric layer, such that the conformal nitride layer surrounds the gate dielectric layer and the metal gate from a top region of the metal gate to the semiconductor region.

* * * * *